United States Patent
Aoki et al.

(10) Patent No.: US 11,062,882 B2
(45) Date of Patent: Jul. 13, 2021

(54) PLASMA PROCESSING APPARATUS AND PLASMA PROCESSING METHOD

(71) Applicant: Tokyo Electron Limited, Tokyo (JP)

(72) Inventors: Yusuke Aoki, Miyagi (JP); Shinya Morikita, Miyagi (JP); Toshikatsu Tobana, Miyagi (JP); Fumiya Takata, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/743,788

(22) Filed: Jan. 15, 2020

(65) Prior Publication Data

US 2020/0234925 A1 Jul. 23, 2020

(30) Foreign Application Priority Data

Jan. 23, 2019 (JP) .............................. JP2019-009476

(51) Int. Cl.
*H01J 37/32* (2006.01)
*H01L 21/3065* (2006.01)

(52) U.S. Cl.
CPC .. *H01J 37/32174* (2013.01); *H01J 37/32091* (2013.01); *H01J 37/32449* (2013.01); *H01L 21/3065* (2013.01)

(58) Field of Classification Search
CPC .......... H01J 37/32174; H01J 37/32449; H01J 37/32091; H01J 37/32697; H01J 37/32146; H01L 21/3065

USPC ..................................................... 216/67, 71
See application file for complete search history.

(56) References Cited

U.S. PATENT DOCUMENTS

| | | | |
|---|---|---|---|
| 2014/0305905 A1* | 10/2014 | Yamada | H01J 37/32568 216/71 |
| 2019/0350072 A1* | 11/2019 | Dorf | H01J 37/3438 |
| 2020/0335305 A1* | 10/2020 | Long | H01J 37/32174 |

FOREIGN PATENT DOCUMENTS

JP 2006-270019 A 10/2006

* cited by examiner

*Primary Examiner* — Binh X Tran
(74) *Attorney, Agent, or Firm* — Studebaker & Brackett PC (57) ABSTRACT

A plasma processing apparatus according to an exemplary embodiment includes a chamber, a substrate support, an upper electrode, a radio frequency power source, and a direct-current power source device. The substrate support includes a lower electrode. The lower electrode is provided in the chamber. The upper electrode is provided above the substrate support. The radio frequency power source generates a plasma in the chamber. The direct-current power source device is electrically connected to the upper electrode. The direct-current power source device is configured to periodically generate a pulsed negative direct-current voltage. An output voltage of the direct-current power source device is alternately switched between a negative direct-current voltage and zero volts.

6 Claims, 7 Drawing Sheets

PLASMA PROCESSING APPARATUS AND PLASMA PROCESSING METHOD

CROSS-REFERENCE TO RELATED APPLICATIONS

This application is based on and claims the benefit of priority from Japanese Patent Application No. 2019-009476 filed on Jan. 23, 2019, the entire contents of which are incorporated herein by reference.

FIELD

Exemplary embodiments of the present disclosure relate to a plasma processing apparatus and a plasma processing method.

BACKGROUND

A plasma processing apparatus is used in manufacture of electronic devices. As a kind of the plasma processing apparatus, a capacitively coupled plasma processing apparatus is known. The capacitively coupled plasma processing apparatus includes a chamber, an upper electrode, and a lower electrode. The lower electrode configures a part of a placing table and is provided in the chamber. The upper electrode is provided above the lower electrode. In the capacitively coupled plasma processing apparatus, radio frequency power is supplied to the upper electrode or the lower electrode, whereby a gas in the chamber is excited, so that a plasma is generated. A substrate on the placing table is processed with chemical species from the generated plasma.

The capacitively coupled plasma processing apparatus may be provided with a direct-current power source and configured to apply a negative direct-current voltage from the direct-current power source to the upper electrode when a plasma is being generated in the chamber. In such a plasma processing apparatus provided with the direct-current power source, it is necessary to provide, in the chamber, a ground block that receives the direct-current current supplied to the upper electrode through a plasma space in the chamber. A plasma processing apparatus provided with the ground block is disclosed in Japanese Patent Application Laid-Open Publication No. 2006-270019.

SUMMARY

In an exemplary embodiment, a plasma processing apparatus is provided. The plasma processing apparatus includes a chamber, a substrate support, an upper electrode, a radio frequency power source, and a direct-current power source device. The substrate support includes a lower electrode. The lower electrode is provided in the chamber. The upper electrode is provided above the substrate support. The radio frequency power source is configured to generate a plasma in the chamber. The direct-current power source device is electrically connected, to the upper electrode. The direct-current power source device is configured to periodically generate a pulsed negative direct-current voltage. An output voltage of the direct-current power source device is a pulsed negative direct-current voltage in a first period in each of cycles which are repeated. The output voltage of the direct-current power source device is zero volts in a remaining second period in each of the cycles.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

In an exemplary embodiment, a plasma processing apparatus is provided. The plasma processing apparatus includes a chamber, a substrate support, an upper electrode, a radio frequency power source, and a direct-current power source device. The substrate support includes a lower electrode. The lower electrode is provided in the chamber. The upper electrode is provided above the substrate support. The radio frequency power source is configured to generate a plasma in the chamber. The direct-current power source device is electrically connected to the upper electrode. The direct-current power source device is configured to periodically generate a pulsed negative direct-current voltage. An output voltage of the direct-current power source device is a pulsed negative direct-current voltage in a first period in each of cycles which are repeated. The output voltage of the direct-current power source device is zero volts in a remaining second period in each of the cycles.

In the above embodiment, the direct-current voltage which is applied to the upper electrode changes between a negative direct-current voltage and zero volts. That is, the energy from the direct-current power source device is transmitted by capacitive coupling rather than direct-current coupling. Therefore, the influence of the electrical characteristics of the components of the plasma processing apparatus on the energy transfer from the direct-current power source device is suppressed. Therefore, it becomes possible to suppress process variation in the plasma processing apparatus configured to apply a negative direct-current voltage to the upper electrode.

In an exemplary embodiment, a frequency that is a reciprocal of the cycles may be 400 kHz or more. In an exemplary embodiment, the frequency may be 1 MHz or less. In an exemplary embodiment, a proportion of the first period in each of the cycles may be 20% or more and 60% or less.

In an exemplary embodiment, a ground electrode of a circuit for transmitting energy from the direct-current power source device may be only a conductive wall portion of the chamber.

In another exemplary embodiment, a plasma processing method is provided. The plasma processing method is executed by using the plasma processing apparatus of any one of various exemplary embodiments described above. The plasma processing method includes supplying radio frequency power from the radio frequency power source to form a plasma from gas in the chamber. The plasma processing method includes periodically applying the pulsed negative direct-current voltage from the direct-current power source device to the upper electrode during generation of the plasma. An output voltage of the direct-current power source device is the pulsed negative direct-current voltage in a first period in each of cycles which are repeated, and is zero volts in a remaining second period in each of the cycles.

Hereinafter, various embodiments will be described in detail with reference to the drawings. In the drawing, the same or equivalent portions are denoted by the same reference symbols.

Figure 1:
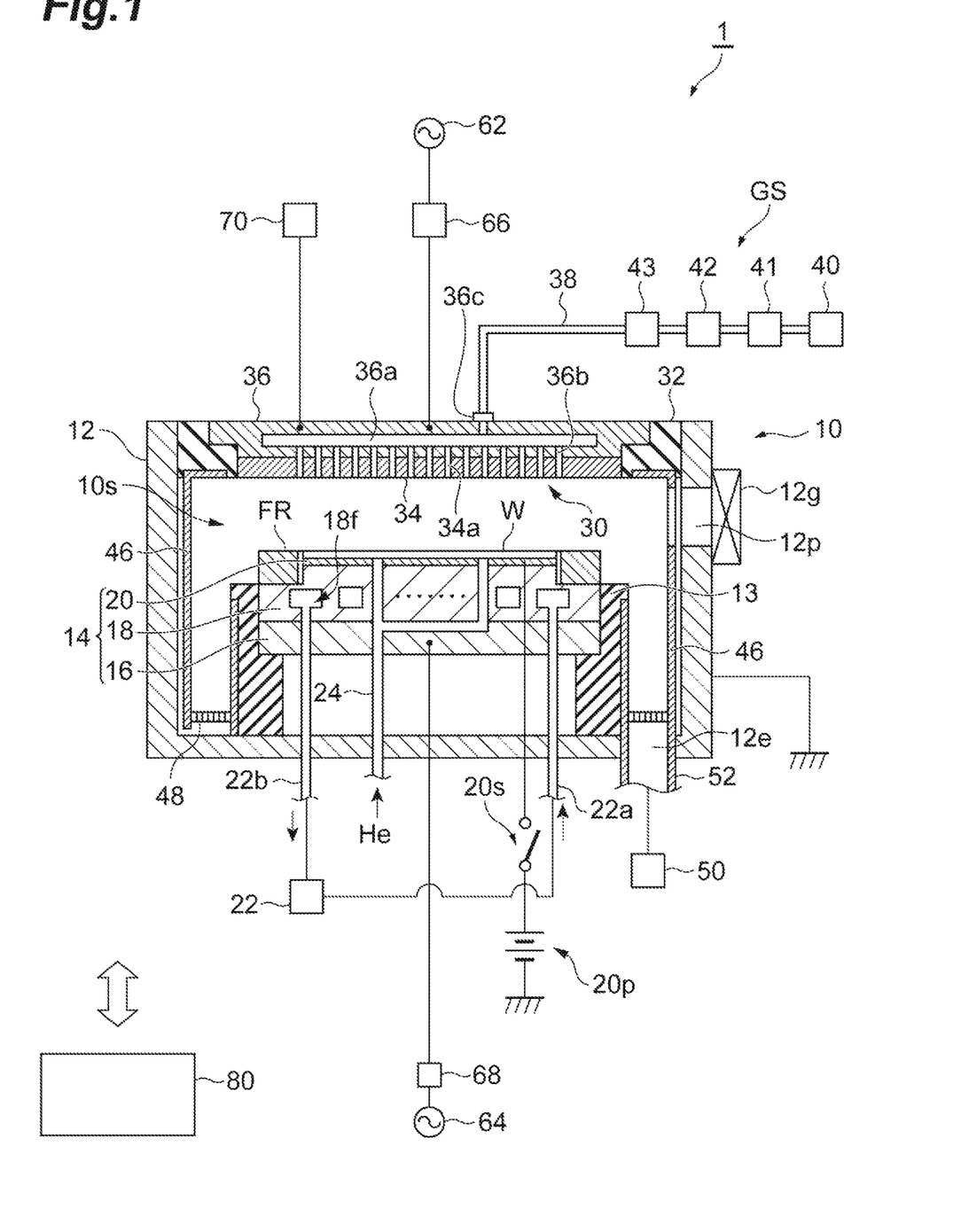
FIG. 1 schematically illustrates a plasma processing apparatus according to an exemplary embodiment.

FIG. 1 is schematically illustrates a plasma processing apparatus according to an exemplary embodiment. A plasma processing apparatus 1 shown in FIG. 1 is a capacitively coupled plasma processing apparatus. The plasma processing apparatus 1 is provided with a chamber 10. The chamber 10 provides an internal space 10s therein.

The chamber 10 includes a chamber body 12. The chamber body 12 has a substantially cylindrical shape. The internal space 10s is provided inside the chamber body 12. The chamber body 12 is formed of a conductor such as aluminum. The chamber body 12 is grounded. A film having corrosion resistance is applied to the inner wall surface of the chamber body 12. The film having corrosion resistance may be a film formed of ceramic such as aluminum oxide or yttrium oxide.

A passage 12p is formed in the side wall of the chamber body 12. A substrate W passes through the passage 12p when it is transferred between the internal space 10s and the outside of the chamber 10. The passage 12p is configured to be able to be opened and closed by a gate valve 12g. The gate valve 12g is provided along a side wall of the chamber body 12.

A support 13 is provided on a bottom portion of the chamber body 12. The support 13 is formed of an insulating material. The support 13 has a substantially cylindrical shape. The support 13 extends upward from the bottom portion of the chamber body 12 in the internal space 10s. The support 13 supports a substrate support 14. The substrate support 14 is configured to support the substrate W in the chamber 10, that is, in the internal space 10s.

The substrate support 14 includes a lower electrode 18 and an electrostatic chuck 20. The lower electrode 18 and the electrostatic chuck 20 are provided in the chamber 10. The substrate support 14 may further include an electrode plate 16. The electrode plate 16 is formed of a conductor such as aluminum, for example, and has a substantially disk shape. The lower electrode 18 is provided on the electrode plate 16. The lower electrode 18 is formed of a conductor such as aluminum, for example, and has a substantially disk shape. The lower electrode 18 is electrically connected to the electrode plate 16.

The electrostatic chuck 20 is provided on the lower electrode 18. The substrate W is placed on an upper surface of the electrostatic chuck 20. The electrostatic chuck 20 has a main body and an electrode. The main body of the electrostatic chuck 20 is formed of a dielectric. The electrode of the electrostatic chuck 20 is an electrode having a film shape and is provided in the main body of the electrostatic chuck 20. The electrode of the electrostatic chuck 20 is connected to a direct-current power source 20p through a switch 20s. If the voltage from the direct-current power source 20p is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

An edge ring FR is disposed on the substrate support 14. The edge ring FR may be formed of silicon, silicon carbide, or quartz, but not limited thereto. When processing of the substrate W is performed in the chamber 10, the substrate W is disposed on the electrostatic chuck 20 and in a region surrounded by the edge ring FR.

A flow path 18f is provided in the interior of the lower electrode 18. A heat exchange medium (for example, a refrigerant) is supplied from a chiller unit 22 to the flow path 18f through a pipe 22a. The chiller unit 22 is provided outside the chamber 10. The heat exchange medium supplied to the flow path 18f is returned to the chiller unit 22 through a pipe 22b. In the plasma processing apparatus 1, the temperature of the substrate W placed on the electrostatic chuck 20 is adjusted by the heat exchange between the heat exchange medium and the lower electrode 18.

The plasma processing apparatus 1 may be further provided with a gas supply line 24. The gas supply line 24 supplies a heat transfer gas (for example, He gas) to a gap between the upper surface of the electrostatic chuck 20 and the back surface of the substrate W. The heat transfer gas is supplied from a heat transfer gas supply mechanism to the gas supply line 24.

The plasma processing apparatus 1 further includes an upper electrode 30. The upper electrode 30 is provided above the substrate support 14. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 can include a top plate 34 and a support 36. The lower surface of the top plate 34 is a lower surface on the internal space 10s side and defines the internal space 10s. The top plate 34 is formed of a silicon-containing material. The top plate 34 is formed of, for example, silicon or silicon carbide. A plurality of gas discharge holes 34a are formed in the top plate 34. The plurality of gas discharge holes 34a penetrate the top plate 34 in a plate thickness direction thereof.

The support 36 detachably supports the top plate 34. The support 36 is formed of a conductive material such as aluminum. A gas diffusion chamber 36a is provided in the interior of the support 36. A plurality of gas holes 36b are formed in the support 36. The plurality of gas holes 36b extend downward from the gas diffusion chamber 36a The plurality of gas holes 36b respectively communicate with the plurality of gas discharge holes 34a A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit GS. The gas source group 40 includes a plurality of gas sources. The plurality of gas sources of the gas source group 40 includes sources of a plurality of gases. Each of the valve group 41 and the valve group 43 includes a plurality of on-optic valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

In the plasma processing apparatus 1, a shield 46 is detachably provided along the inner wall surface of the chamber body 12. The shield 46 is also provided on the outer periphery of the support 13. The shield 46 prevents a byproduct of plasma processing from adhering to the chamber body 12. The shield 46 is configured, for example, by forming a film having corrosion resistance on a surface of a member formed of aluminum. The film having corrosion resistance may be a film formed of ceramic such as yttrium oxide.

A baffle plate 48 is provided between the support 13 and the side wall of the chamber body 12. The baffle plate 48 is configured, for example, by forming a film having corrosion resistance on a surface of a member formed of aluminum. The film having corrosion resistance may be a film formed of ceramic such as yttrium oxide. A plurality of through-holes are formed in the baffle plate 48. An exhaust port 12e is provided below the baffle plate 48 and in the bottom portion of the chamber body 12. An exhaust device 50 is connected to the exhaust port 12e through an exhaust pipe 52. The exhaust device 50 has a pressure adjusting valve and a vacuum pump such as a turbo molecular pump.

The plasma processing apparatus 1 further includes a first radio frequency power source 62 and a second radio frequency power source 64. The first radio frequency power source 62 is a power source configured to generate first radio frequency power. In an example, the first radio frequency power has a frequency suitable for the generation of a plasma. The frequency of the first radio frequency power is, for example, a frequency in a range of 27 MHz to 100 MHz. The first radio frequency power source 62 is connected to the upper electrode 30 through a matcher 66. The matcher 66 has a circuit configured to match the output impedance of the first radio frequency power source 62 with the impedance on the load side (the upper electrode 30 side). The first radio frequency power source 62 may be connected to the lower electrode 18 through the matcher 66.

The second radio frequency power source 64 is a power source configured to generate second radio frequency power. The second radio frequency power has a frequency lower than the frequency of the first radio frequency power. The second radio frequency power may be used as bias radio frequency power for attracting ions to the substrate W. The frequency of the second radio frequency power is, for example, a frequency in a range of 400 kHz to 40 MHz. The second radio frequency power source 64 is connected to the lower electrode 18 through a matcher 68 and the electrode plate 16. The matcher 68 has a circuit configured to match the output impedance of the second radio frequency power source 64 with the impedance on the load side (the lower electrode 18 side).

Figure 2:
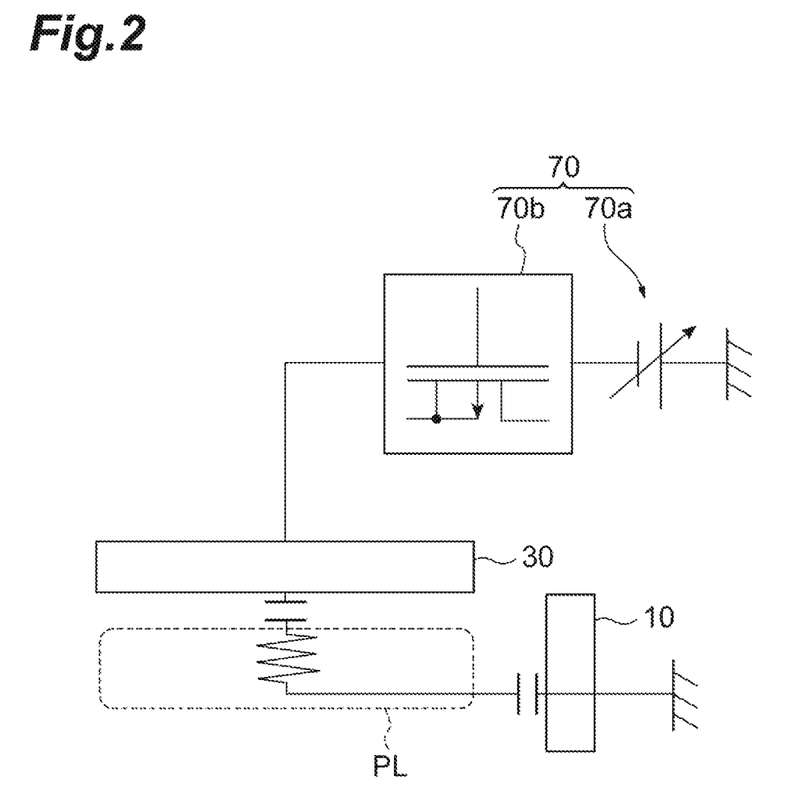
FIG. 2 illustrates an example of a configuration of a direct-current power source device of the plasma processing apparatus shown in FIG. 1.
Figure 3:
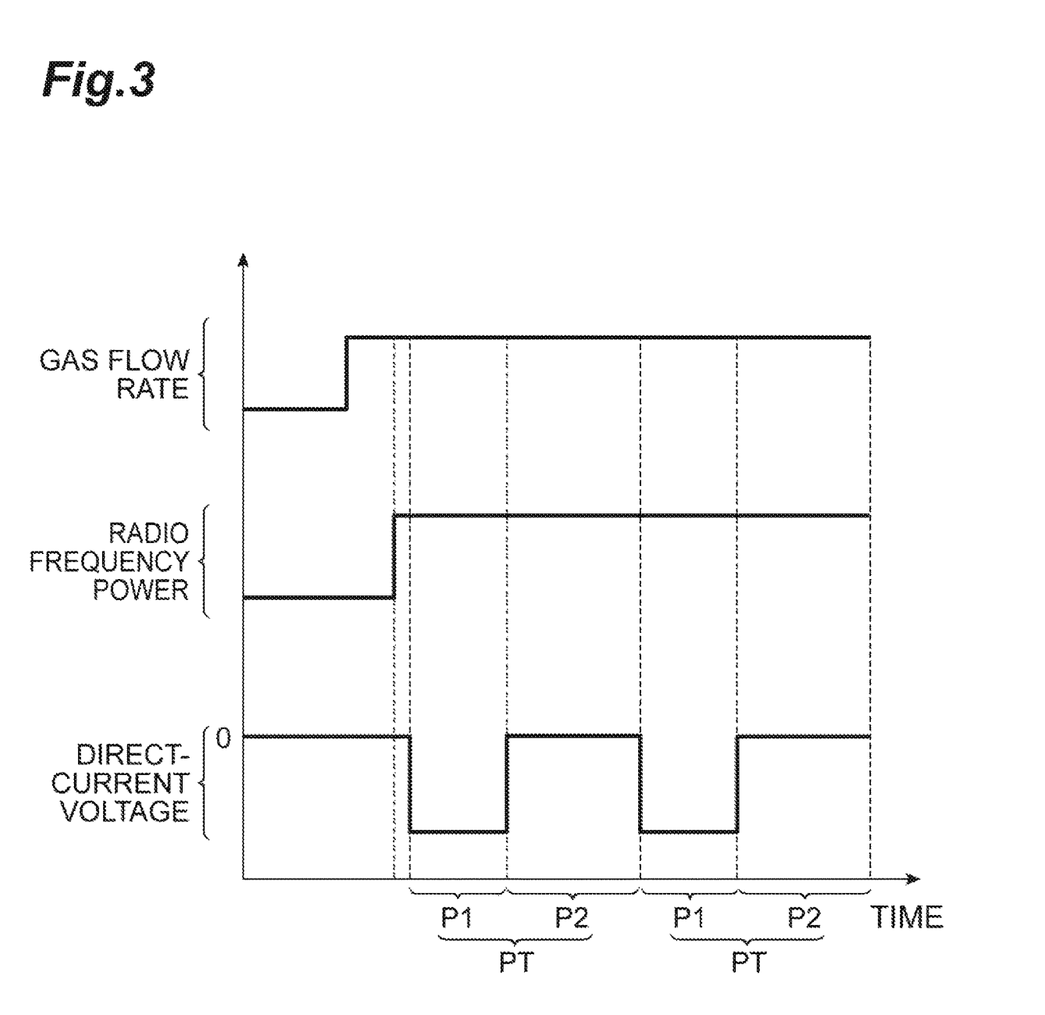
FIG. 3 is a timing chart of plasma processing which is executed using the plasma processing apparatus according to an exemplary embodiment.

The plasma processing apparatus 1 further includes a direct-current power source device 70. The direct-current power source device 70 is electrically connected to the upper electrode 30. The direct-current power source device 70 is configured to periodically generate a pulsed negative direct-current voltage. FIG. 2 illustrates an example of a configuration of the direct-current power source device of the plasma processing apparatus shown in FIG. 1. FIG. 3 is a timing chart of plasma processing which is executed by using the plasma processing apparatus according to an exemplary embodiment. In FIG. 3, the horizontal axis represents time. In FIG. 3, the vertical axis represents a flow rate (i.e. gas flow rate) of a gas which is supplied into the chamber 10, supply of radio frequency power (the first radio frequency power and/or the second radio frequency power), and the direct-current voltage. In FIG. 3, a high level of radio frequency power indicates that the radio frequency power is being supplied. In FIG. 3, a low level of radio frequency power indicates that the radio frequency power is not supplied. Hereinafter, FIGS. 2 and 3 will be referred to together with FIG. 1.

In an embodiment, the direct-current power source device 70 includes a variable direct-current power source 70a and a switching device 70b. The variable direct-current power source 70a is configured to generate a negative direct-current voltage continuously. The level of the negative direct-current voltage which is output from the variable direct-current power source 70a can be controlled by a control unit 80, which will be described later. The switching device 70b switches connection and disconnection between the variable direct-current power source 70a and the upper electrode 30 by switching of a conduction state thereof. The switching of the conduction state of the switching device 70b may be controlled by the control unit 80.

As described above, the output voltage of the direct-current power source device 70 is a pulsed negative direct-current voltage in a first period P1 in each of cycles PT which are repeated. In an embodiment, in the first period P1 within each of the cycles PT, the conduction state of the switching device 70b is switched such that the variable direct-current power source 70a and the upper electrode 30 are connected to each other. The output voltage of the direct-current power source device 70 is zero volts in the remaining second period P2 in each of the cycles PT. In an embodiment, in the second period P2 within each of the cycles PT, the conduction state of the switching device 70b is switched such that the variable direct-current power source 70a and the upper electrode 30 are disconnected from each other.

In an embodiment, a frequency f that is the reciprocal of the cycles PT (or the cycle time of each of the cycles PT) may be 400 kHz or more. In an embodiment, the frequency f may be 1 MHz or less. In a case where the frequency f is 1 MHz or less, the independent controllability of the behavior of ions with respect to the generation of radicals in the chamber 10 is enhanced. In an embodiment, the proportion of the first period P1 in each of the cycles PT (that is, the duty ratio of the pulsed negative direct-current voltage) may be 20% or more and 60% or less.

The plasma processing apparatus 1 further includes the control unit 80. The control unit 80 can be a computer which includes a processor, a storage unit such as a memory, an input device, a display device, a signal input/output interface, and the like. The control unit 80 controls each part of the plasma processing apparatus 1. In the control unit 80, an operator can perform a command input operation and the like by using the input device in order to manage the plasma processing apparatus 1. Further, in the control unit 80, the operating status of the plasma processing apparatus 1 can be visualized and displayed by the display device. Further, a control program and recipe data are stored in the storage unit of the control unit 80. The control program is executed by the processor of the control unit 80 to execute various processing in the plasma processing apparatus 1. The processor of the control unit 80 executes the control program and controls each part of the plasma processing apparatus 1 according to the recipe data, whereby a plasma processing method of an embodiment which will be described later is executed in the plasma processing apparatus 1.

In the plasma processing apparatus 1, the direct-current voltage which is applied to the upper electrode 30 changes between a negative direct-current voltage and zero volts. That is, the energy from the direct-current power source device 70 is transmitted by capacitive coupling rather than direct-current coupling. Therefore, the influence of the electrical characteristics of the components of the plasma processing apparatus 1 on the energy transfer from the direct-current power source device 70 is suppressed. Therefore, it becomes possible to suppress process variation in the plasma processing apparatus configured to apply a negative direct-current voltage to the upper electrode 30.

Figure 4:
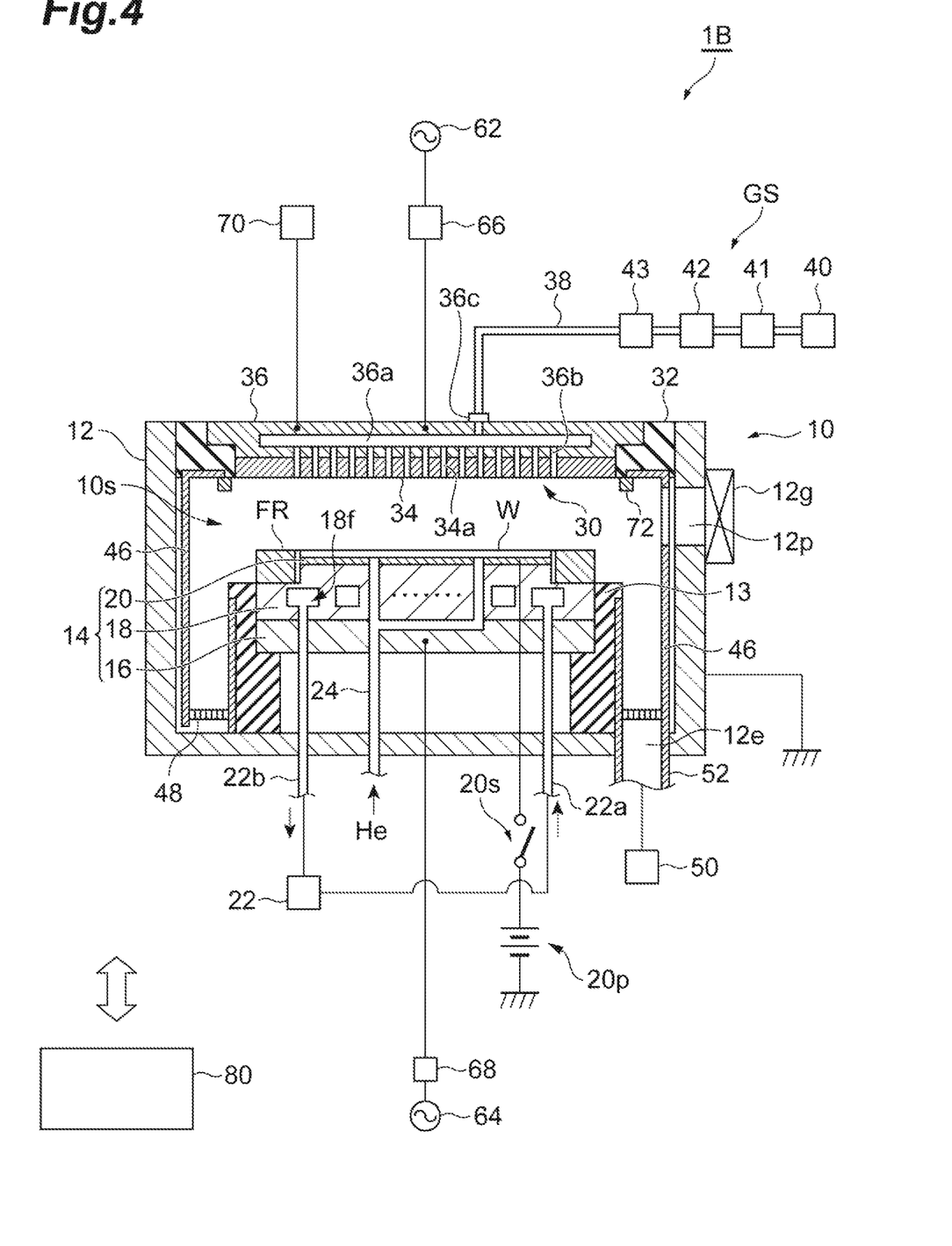
FIG. 4 schematically illustrates a plasma processing apparatus according to another exemplary embodiment.

Hereinafter, a plasma processing apparatus according to another exemplary embodiment will be described with reference to FIG. 4. FIG. 4 is a diagram schematically showing the plasma processing apparatus according to another exemplary embodiment. A plasma processing apparatus 1B shown in FIG. 4 includes a ground electrode 72 in addition to the same constituent elements as the constituent elements of the plasma processing apparatus 1. The ground electrode 72 is provided in the chamber 10 and is grounded. In the plasma processing apparatus 1B, a circuit that transmits the energy from the direct-current power source device 70 is composed of the upper electrode 30, the plasma formed in the internal space 10s, and the ground electrode 72. On the other hand, in the plasma processing apparatus 1, the circuit that transmits the energy from the direct-current power source device 70 is composed of the upper electrode 30, a plasma PL (refer to FIG. 2) in the internal space 10s, and the conductive wall portion (that is, the chamber body 12) of the chamber 10. That is, in the plasma processing apparatus 1, the ground electrode of the circuit that transmits the energy from the direct-current power source device 70 is only the conductive wall portion (that is, the chamber body 12) of the chamber 10.

In an embodiment, the ground electrode 72 is provided to be in contact with the lower surface of the member 32 around the upper electrode 30. Alternatively, the ground electrode 72 is provided to be in contact with the shield 46 around the upper electrode 30. The ground electrode 72 can have a ring shape, for example.

As described above, the energy from the direct-current power source device 70 is transmitted by capacitive coupling rather than direct-current coupling. Therefore, the influence of the electrical characteristics of the components of the plasma processing apparatus 1 on the energy transfer from the direct-current power source device 70 is suppressed. Therefore, the effect that process variation in the plasma processing apparatus configured to apply a negative direct-current voltage to the upper electrode 30 can be suppressed is obtained without depending on the presence or absence of the ground electrode 72.

Figure 5:
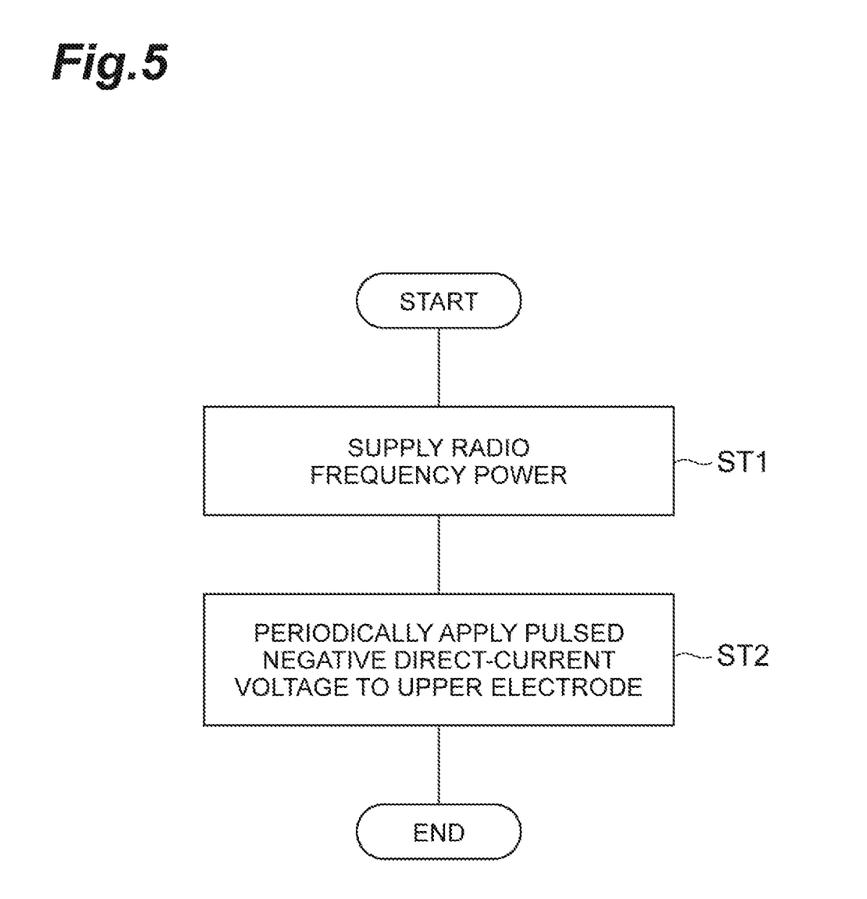
FIG. 5 is a flowchart of a plasma processing method according to an exemplary embodiment.

Hereinafter, a plasma processing method according to an exemplary embodiment will be described with reference to FIG. 5 together with FIG. 3. FIG. 5 is a flowchart of the plasma processing method according to an exemplary embodiment. Hereinafter, the plasma processing method (hereinafter referred to as a "method MT") shown in FIG. 5 will be described by taking as an example a case where the method is performed using the plasma processing apparatus 1 or the plasma processing apparatus 1B.

The method MT is performed in a state where the substrate W to be processed is held by the electrostatic chuck 20 in the chamber 10. In the method MT, as shown in FIG. 3, the introduction of gas into the chamber 10 is started. In order to supply the gas into the chamber 10, the control unit 80 controls the gas supply unit GS. Further, the exhaust device 50 is controlled by the control unit 80 to set the pressure in the chamber 10 to a specified pressure.

Then, as shown in FIGS. 3 and 5, step ST1 is executed after the gas supply is started. In step ST1, the supply of the radio frequency power, that is, the first radio frequency power and/or the second radio frequency power is started. In order to execute step ST1, the control unit 80 controls the first radio frequency power source 62 and/or the second radio frequency power source 64.

In subsequent step ST2, a pulsed negative direct-current voltage is periodically applied to the upper electrode 30 by the direct-current power source device 70. As described above, the output voltage of the direct-current power source device 70 is a pulsed negative direct-current voltage in the first period P1 in each of the cycles PT which are repeated. The output voltage of the direct-current power source device 70 is zero volts in the remaining second period P2 in each of the cycles PT. In order to execute step ST2, the direct-current power source device 70 may be controlled by the control unit 80.

While various exemplary embodiments have been described above, various additions, omissions, substitutions and changes may be made without being limited to the exemplary embodiments described above. Elements of the different embodiments may be combined to form another embodiment.

Hereinafter, experiments performed for the evaluation of the plasma processing apparatus 1 and the plasma processing apparatus 1B will be described. The present disclosure is not limited by the experiments which will be described below.

First Experiment and Second Experiment

In a first experiment and a second experiment, a sample having a silicon oxide film was prepared. The sample had a disk shape having a diameter of 300 mm. In the first experiment, plasma etching of the silicon oxide film of the sample was performed by using the plasma processing apparatus 1. In the second experiment, plasma etching of the silicon oxide film of the sample was performed by using the plasma processing apparatus 1B. The conditions of the first experiment and the second experiment are shown below <Conditions of First Experiment and Second Experiment>

Figure 6:
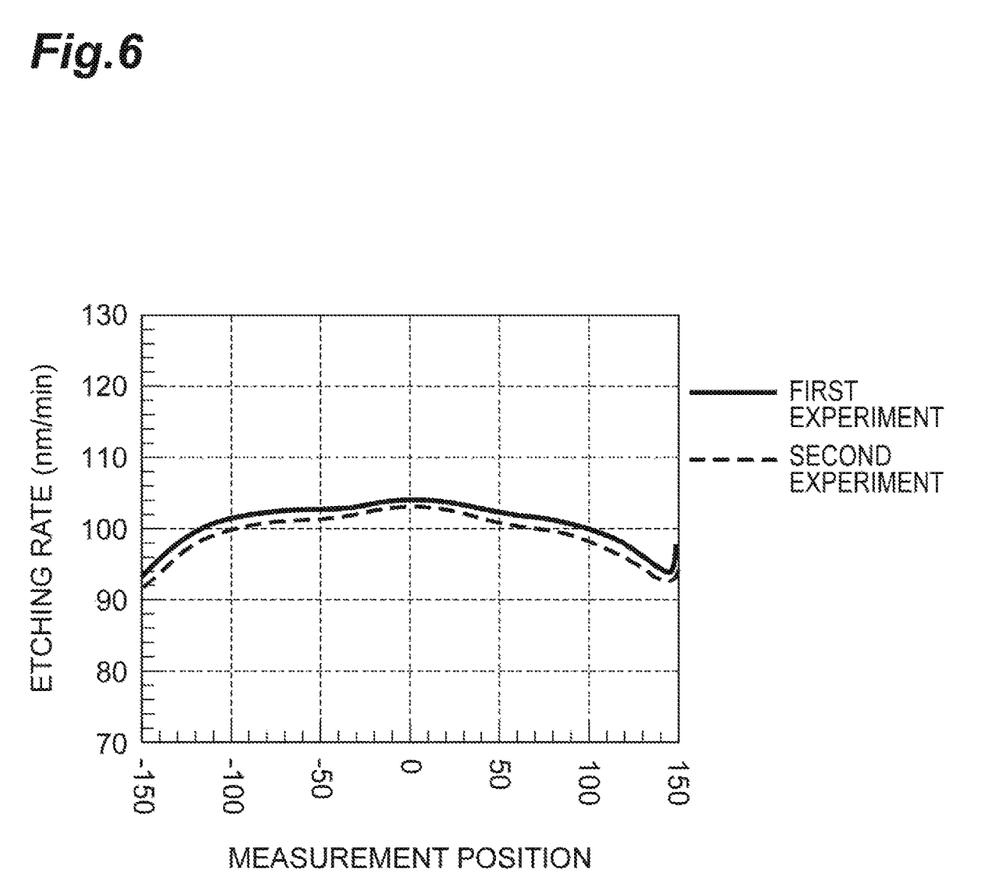
FIG. 6 is a graph showing etching rate distribution obtained in a first experiment and etching rate distribution obtained in a second experiment.

Pressure in the chamber 10: 133 Pa
Flow rate of $CF_4$ gas: 50 sccm
Flow rate of Ar gas: 600 sccm
First radio frequency power: 60 MHz, 1000 W
Second radio frequency power: 40 MHz, 550 W
Frequency f of pulsed negative direct-current voltage: 400 kHz
Duty ratio of pulsed negative direct-current voltage: 50%
Pulsed negative direct-current voltage: −900 V In each of the first experiment and the second experiment, the etching rate of the silicon oxide film was Obtained at a plurality of measurement positions on the diameter of the sample. The results are shown in FIG. 6. In FIG. 6, the horizontal axis represents the measurement position. The measurement position is represented by a distance (mm) in a radial direction from the center of the sample. The measurement position represented by a negative distance is a position on the side opposite to the measurement position represented by a positive distance with the center of the sample as a reference. In FIG. 6, the vertical axis represents the etching rate. As shown in FIG. 6, the distribution of the etching rate in the first experiment using the plasma processing apparatus 1 approximately coincided with the distribution of the etching rate in the second experiment using the plasma processing apparatus 1B. Therefore, it was confirmed that the influence of the electrical characteristics of the components of the plasma processing apparatus on the energy transfer from the direct-current power source device is suppressed by periodically applying a pulsed negative direct-current voltage from the direct-current power source device to the upper electrode.

Third Experiment and Fourth Experiment

In a third experiment and a fourth experiment, a first step and a second step were alternately executed by using the plasma processing apparatus 1B. In the first step, film formation by plasma-enhanced CVD was performed to form a film on the inner wall surface of the chamber 10. In the second step, a plasma of a processing gas was generated in the chamber 10. In the second step of the third experiment, a pulsed negative direct-current voltage was periodically applied to the upper electrode 30. In the second step of the fourth experiment, a negative direct-current voltage was continuously applied to the upper electrode 30. The conditions of each of the first step and the second step in the third experiment and the fourth experiment are shown below.

Figure 7A:
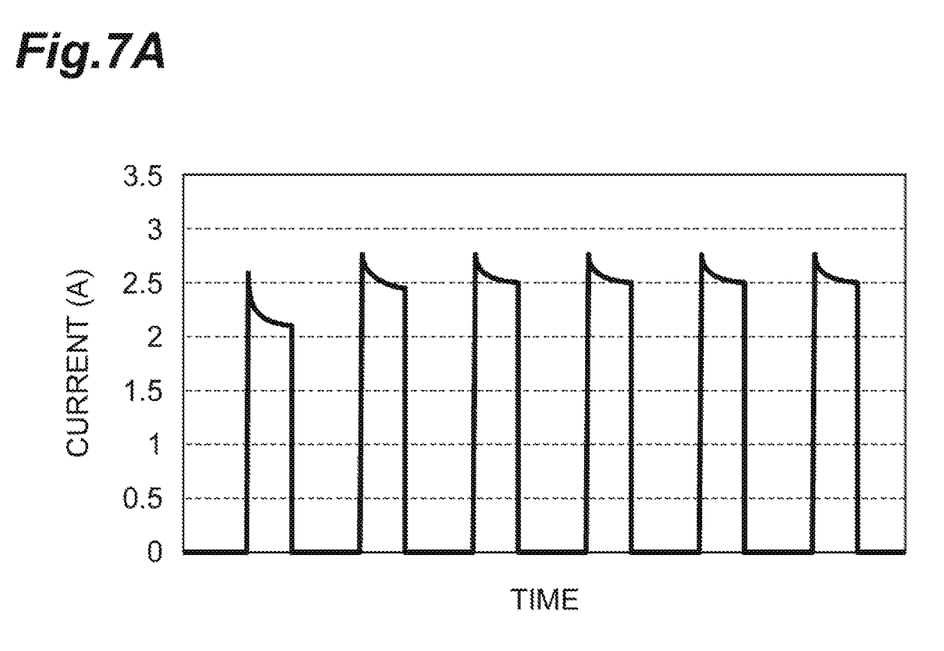
FIG. 7A is a graph showing a direct-current current obtained in a third experiment.
Figure 7B:
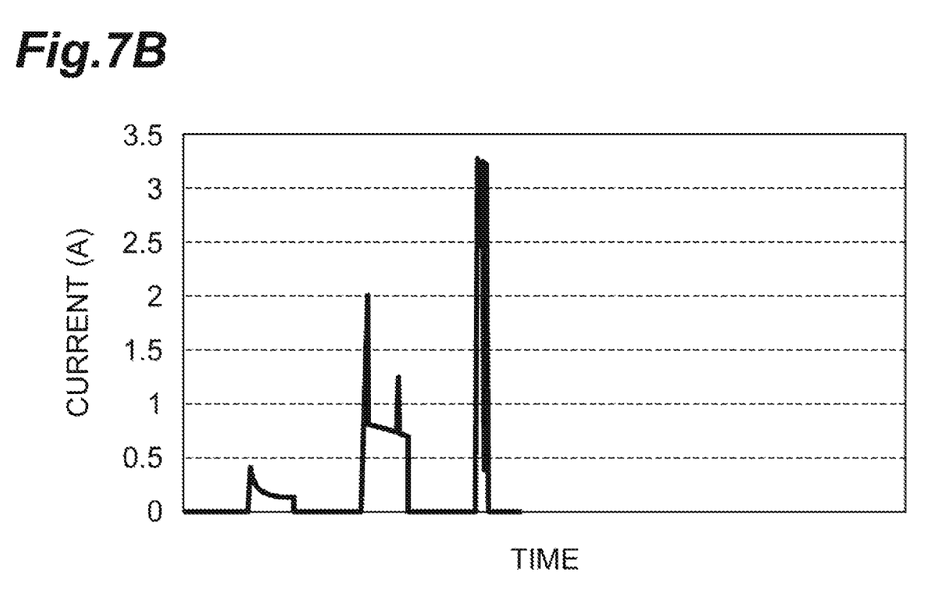
FIG. 7B is a graph showing a direct-current current obtained in a fourth experiment.

<Conditions of First Step of each of Third Experiment and Fourth Experiment>
Pressure in the chamber 10: 2.7 Pa
Flow rate of SiCl$_4$ gas: 5 sccm
Flow rate of O$_2$ gas: 50 sccm
Flow rate of Ar gas: 800 sccm
First radio frequency power: 60 MHz, 1000 W
Second radio frequency power: 40 MHz, 0 W
Processing time: 30 seconds
<Conditions of Second Step of Third Experiment>
Pressure in the chamber 10: 6.7 Pa
Flow rate of H$_2$ gas: 100 sccm
Flow rate of Ar gas: 800 sccm
First radio frequency power: 60 MHz, 300 W
Second radio frequency power: 40 MHz, 0 W
Frequency f of pulsed negative direct-current voltage: 400 kHz
Duty ratio of pulsed negative direct-current voltage: 50%
Pulsed negative direct-current voltage: −900 V
Processing time: 30 seconds
<Conditions of Second Step of Fourth Experiment>
Pressure in the chamber 10: 6.7 Pa
Flow rate of gas: 100 sccm
Flow rate of Ar gas: 800 sccm
First radio frequency power: 60 MHz, 300 W
Second radio frequency power: 40 MHz, 0 W
Negative direct-current voltage: −900 V
Processing time: 30 seconds In the third experiment and the fourth experiment, the direct-current (DC) current flowing through the upper electrode 30 during the execution of each of the first step and the second step was measured. The results are shown in FIG. 7A and FIG. 7B. In FIG. 7A, the horizontal axis represents time, and the vertical axis represents the DC current flowing through the upper electrode 30 in the third experiment. In FIG. 7B, the horizontal axis represents time, and the vertical axis represents the direct-current (DC) current flowing through the upper electrode 30 in the fourth experiment. As shown in FIG. 7B, in the fourth experiment in which a direct-current voltage is continuously applied to the upper electrode 30 in the second step, the DC current flowing through the upper electrode 30 in the second step greatly fluctuated according to an increase in the number of repetitions of the first step and the second step. On the other hand, as shown in FIG. 7A, in the third experiment in which a pulsed negative direct-current voltage is periodically applied to the upper electrode 30 in the second step, the DC current flowing through the upper electrode 30 in the second step was stable without substantially depending on the number of repetitions of the first step and the second step. Therefore, it was confirmed that the influence of the electrical characteristics of the components of the plasma processing apparatus on the energy transfer from the direct-current power source device is suppressed by periodically applying a pulsed negative direct-current voltage from the direct-current power source device to the upper electrode.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
    a chamber;
    a substrate support which includes a lower electrode provided in the chamber;
    an upper electrode provided above the substrate support;
    a radio frequency power source configured to generate a plasma in the chamber; and
    a direct-current power source device electrically connected to the upper electrode, wherein
    the direct-current power source device is configured to periodically generate a pulsed negative direct-current voltage,
    an output voltage of the direct-current power source device is the pulsed negative direct-current voltage in a first period in each of cycles which are repeated, and is zero volts in a remaining second period in each of the cycles, and
    a frequency that is a reciprocal of the cycles is 400 kHz or more and is 1 MHz or less.

2. The plasma processing apparatus according to claim 1, wherein
    a proportion of the first period in each of the cycles is 20% or more and 60% or less.

3. The plasma processing apparatus according to claim 1, wherein
    a ground electrode of a circuit for transmitting energy from the direct-current power source device is only a conductive wall portion of the chamber.

4. The plasma processing apparatus according to claim 1, wherein radio frequency power generated by the radio frequency power source to generate the plasma is maintained constant during the cycles.

5. A plasma processing method using the plasma processing apparatus according to claim 1, the method comprising:
supplying radio frequency power from the radio frequency power source to generate a plasma in the chamber; and
periodically applying the pulsed negative direct-current voltage from the direct-current power source device to the upper electrode during generation of the plasma, wherein
an output voltage of the direct-current power source device is the pulsed negative direct-current voltage in a first period in each of cycles which are repeated, and is zero volts in a remaining second period in each of the cycles.

6. The plasma processing method according to claim 5, wherein
radio frequency power generated by the radio frequency power source to generate the plasma is maintained constant during the cycles.

\* \* \* \* \*